United States Patent
Seo et al.

(10) Patent No.: US 11,216,339 B2
(45) Date of Patent: *Jan. 4, 2022

(54) SEMICONDUCTOR MEMORY DEVICES, MEMORY SYSTEMS AND METHODS OF OPERATING SEMICONDUCTOR MEMORY DEVICES

(71) Applicant: Samsung Electronics Co., Ltd., Suwon-si (KR)

(72) Inventors: Young-Hun Seo, Hwaseong-si (KR); Kwang-Il Park, Yongin-si (KR); Seung-Jun Bae, Hwaseong-si (KR); Sang-Uhn Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/105,205

(22) Filed: Nov. 25, 2020

(65) Prior Publication Data

US 2021/0081278 A1 Mar. 18, 2021

Related U.S. Application Data

(63) Continuation of application No. 16/228,560, filed on Dec. 20, 2018, now Pat. No. 10,884,852.

(30) Foreign Application Priority Data

Feb. 13, 2018 (KR) .......................... 10-2018-0017335

(51) Int. Cl.
*G06F 11/00* (2006.01)
*G06F 11/10* (2006.01)
*G11C 29/52* (2006.01)
*G11C 11/4093* (2006.01)
*H01L 25/065* (2006.01)

(52) U.S. Cl.
CPC ...... *G06F 11/1068* (2013.01); *G06F 11/1048* (2013.01); *G11C 11/4093* (2013.01); *G11C 29/52* (2013.01); *H01L 25/0657* (2013.01); *H01L 2225/06541* (2013.01)

(58) Field of Classification Search
None
See application file for complete search history.

(56) References Cited

U.S. PATENT DOCUMENTS 5,896,404 A 4/1999 Kellogg et al.
6,957,378 B2 10/2005 Koga et al.
(Continued)

FOREIGN PATENT DOCUMENTS

JP 2011-238309 A 11/2011

*Primary Examiner* — Mujtaba M Chaudry
(74) *Attorney, Agent, or Firm* — Muir Patent Law, PLLC

(57) ABSTRACT

A semiconductor memory device includes an error correction code (ECC) engine, a memory cell array, an input/output (I/O) gating circuit and a control logic circuit. The memory cell array includes a normal cell region configured to store main data and a parity cell region configured to selectively store parity data which the ECC engine generates based on the main data, and sub data received from outside of the semiconductor memory device. The control logic circuit controls the ECC engine to selectively perform an ECC encoding and an ECC decoding on the main data and controls the I/O gating circuit to store the sub data in at least a portion of the parity cell region.

12 Claims, 20 Drawing Sheets

(56) References Cited

U.S. PATENT DOCUMENTS

| | | | |
|---|---|---|---|
| 7,366,971 B2 | 4/2008 | Kikutake et al. | |
| 7,779,334 B2 | 8/2010 | Earle et al. | |
| 8,078,938 B2 | 12/2011 | Kawabuta | |
| 8,151,173 B2 | 4/2012 | Hirose et al. | |
| 8,495,467 B1* | 7/2013 | Billing | G11C 29/44 |
| | | | 714/764 |
| 9,886,340 B2 | 2/2018 | Ahn et al. | |
| 2008/0056025 A1* | 3/2008 | Kanagawa | G06F 11/1044 |
| | | | 365/189.15 |
| 2011/0113187 A1* | 5/2011 | Kashiwagi | G11C 16/16 |
| | | | 711/103 |
| 2011/0225475 A1* | 9/2011 | Kumar | G06F 11/1052 |
| | | | 714/763 |
| 2013/0055012 A1* | 2/2013 | Roh | G06F 11/20 |
| | | | 714/6.22 |
| 2014/0245105 A1* | 8/2014 | Chung | G06F 11/1076 |
| | | | 714/763 |
| 2014/0331101 A1* | 11/2014 | Chung | G06F 11/1056 |
| | | | 714/755 |
| 2015/0067448 A1* | 3/2015 | Son | G11C 29/52 |
| | | | 714/773 |
| 2015/0089327 A1* | 3/2015 | Youn | G11C 29/76 |
| | | | 714/768 |
| 2015/0372697 A1* | 12/2015 | Alhussien | H03M 13/2909 |
| | | | 714/755 |
| 2015/0378821 A1* | 12/2015 | Manasse | G06F 11/1076 |
| | | | 714/764 |
| 2017/0031756 A1* | 2/2017 | Chung | G11C 7/20 |
| 2019/0065101 A1* | 2/2019 | Yeh | G06F 3/0604 |

\* cited by examiner

FIG. 12

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATIONS

This application is a Continuation of U.S. patent application Ser. No. 16/228,560, filed on Dec. 20, 2018, now allowed, which claims priority under 35 USC § 119 to Korean Patent Application No. 10-2018-0017335, filed on Feb. 13, 2018, in the Korean Intellectual Property Office, the disclosure of each of which is incorporated herein by reference in its entirety.

BACKGROUND

The present disclosure relates to memories, and more particularly to semiconductor memory devices, memory systems and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. Therefore, the DRAMs reduce the bit errors by employing an error correction code (ECC) engine therein. The ECC engine often uses a region of memory to store parity bits (e.g., a parity cell region) as part of detecting and correcting erroneous bits (or error bits) of a certain set of data. In some implementations, a portion of the parity cell region may not be used, thus it is desired to increase usability of the parity cell region.

SUMMARY

According to example embodiments, a semiconductor memory device includes an error correction code (ECC) engine, a memory cell array, an input/output (I/O) gating circuit and a control logic circuit. The memory cell array includes a plurality of dynamic memory cells and includes a normal cell region configured to store main data and a parity cell region configured to selectively store parity data which the ECC engine generates based on the main data, and sub data received from outside of the semiconductor memory device. The I/O gating circuit is connected between the ECC engine and the memory cell array. The control logic circuit controls the ECC engine and the I/O gating circuit based on an address and a command received from outside of the semiconductor memory device. The control logic circuit controls the ECC engine to selectively perform an ECC encoding and an ECC decoding on the main data, and controls the I/O gating circuit to store the sub data in at least a portion of the parity cell region. The sub data may include write parity data corresponding to the main data.

According to example embodiments, a memory system includes a semiconductor memory device and a memory controller that controls the semiconductor memory device and includes a first error correction code (ECC) engine. The semiconductor memory device includes a second ECC engine, a memory cell array, an input/output (I/O) gating circuit and a control logic circuit. The memory cell array includes a plurality of dynamic memory cells and includes a normal cell region configured to store main data and a parity cell region configured to selectively store parity data which the second ECC engine generates based on the main data, and store sub data corresponding to write parity data. The I/O gating circuit is connected between the second ECC engine and the memory cell array. The control logic circuit controls the second ECC engine and the I/O gating circuit based on an address and a command received from the memory controller. The control logic circuit controls the second ECC engine to selectively perform an ECC encoding and an ECC decoding on the main data and controls the I/O gating circuit to store the sub data from the memory controller in at least a portion of the parity cell region. The memory controller is configured to generate the write parity data based on the main data.

According to example embodiments, in a method of operating a semiconductor memory device including an error correction code (ECC) engine and a memory cell array that includes a normal cell region and a parity cell region, main data and sub data are, in the semiconductor memory device, received from an external memory controller, the sub data is stored in a first portion of the parity cell region while storing the main data in the normal cell region, and the main data and the sub data read from the memory cell array are transmitted to the memory controller in response to a read command from the memory controller. The sub data may include write parity data generating by the memory controller based on the main data.

Accordingly, the semiconductor memory device according to example embodiments may adaptively set ECC levels based on the importance degree of the write data to use the parity cell region as a data storage region to store data which the memory controller generates. Therefore, the semiconductor memory device may increase usability of the parity cell region to reduce the size overhead of the parity cell region.

BRIEF DESCRIPTION OF THE DRAWINGS

Example embodiments will be described below in more detail with reference to the accompanying drawings.

FIG. 12 is a diagram for describing ECC levels according to data bits of the main data and parity bits of the parity data.

DETAILED DESCRIPTION

Various example embodiments will be described more fully hereinafter with reference to the accompanying drawings, in which example embodiments are shown.

Figure 1:
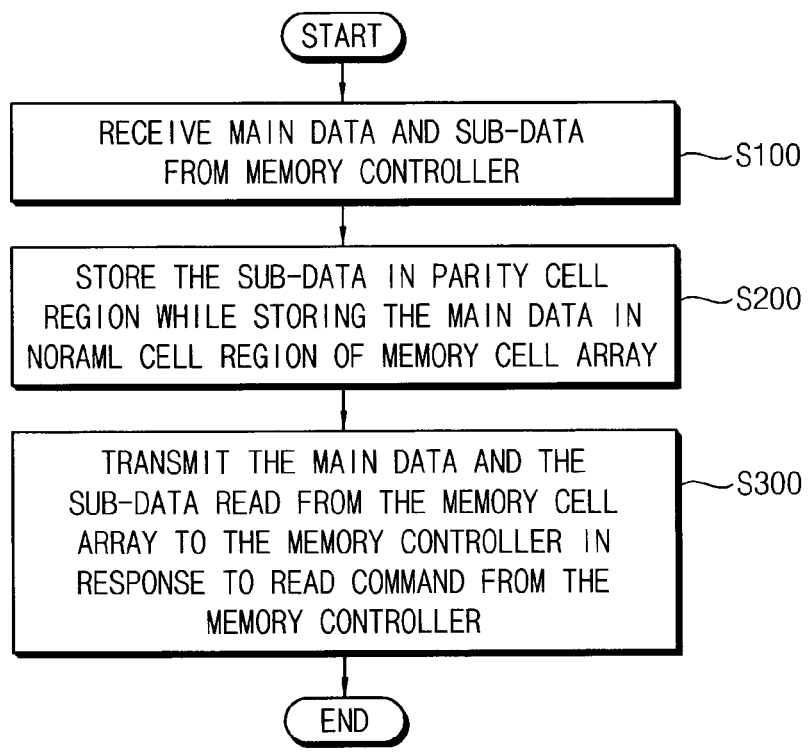
FIG. 1 is a flow chart illustrating a method of operating a semiconductor memory device according to example embodiments.

FIG. 1 is a flow chart illustrating a method of operating a semiconductor memory device according to example embodiments.

Referring to FIG. 1, the semiconductor memory device receives main data and sub data from a memory controller (S100). The semiconductor memory device may include an error correction code (ECC) engine and a memory cell array that includes a normal cell region and a parity cell region.

The parity cell region may store parity data which the ECC engine generates. The semiconductor memory device may enable or disable the ECC engine based on an importance degree of the main data and also may determine error correction capability of the ECC engine. The sub data may be one of write parity data generated and provided by the memory controller and/or a configuration data used to configure the semiconductor memory device.

The semiconductor memory device may store the sub data in at least a portion of the parity cell region while storing the main data in the normal cell region of the memory cell array (S200). The semiconductor memory device may store the sub data in only a portion of the parity cell region or in the entire parity cell region based on whether the ECC engine of the semiconductor memory device is enabled.

The semiconductor memory device transmits the main data and the sub data read from the memory cell array to the memory controller in response to a read command from the memory controller (S300).

Therefore, in a method of operating a semiconductor memory device according to example embodiments, the parity cell region, which may be used to store parity data, is used as a data storage region to store data generated and provided by the memory controller. Accordingly, usability of the parity cell region may be increased and/or a size of the parity cell region dedicated to the storage of parity data generated by the ECC engine of the semiconductor memory device may be reduced.

Figure 2:
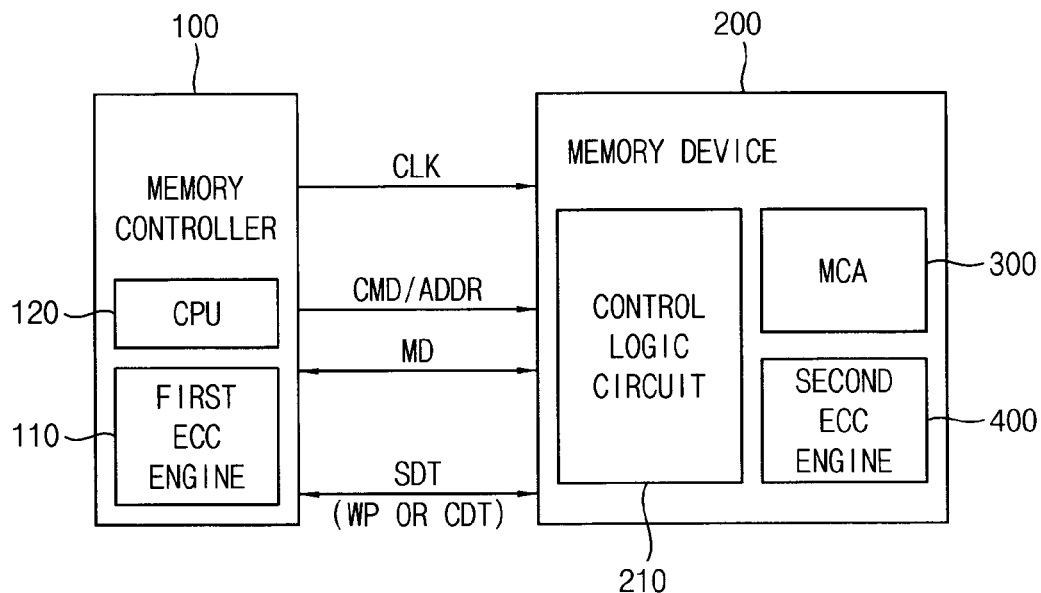
FIG. 2 is a block diagram illustrating a memory system according to example embodiments.

FIG. 2 is a block diagram illustrating a memory system according to example embodiments.

Referring to FIG. 2, a memory system 20 may include a memory controller 100 and at least one semiconductor memory device 200. The memory controller may be an integrated circuit formed in a semiconductor chip (also referred to herein as a "die"). Each of the semiconductor memory devices 200 may be formed as a semiconductor chip.

The memory controller 100 may control overall operation of the memory system 20. The memory controller 100 may control overall data exchange between an external host (not shown) and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

The memory controller 100 may include a first ECC engine 110 and a central processing unit (CPU) 120. The CPU 120 may control overall operation of the memory controller 100. The first ECC engine 110 may detect an error bit in data from the semiconductor memory device 200 and may correct the error bit.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address (signal) ADDR to the semiconductor memory device 200 and exchanges main data MD and sub data SDT with the semiconductor memory device 200. The sub data SDT may correspond to one of write parity data WP which the first ECC engine 110 generates and configuration data (setting data) CDT associated with configuration (or setting) of the semiconductor memory device 200.

The first ECC engine 110 may generate the write parity data WP by performing an ECC encoding on the main data MD using one of a plurality of ECCs.

The semiconductor memory device 200 includes a memory cell array 300 that stores the main data MD and the sub data SDT, a second ECC engine 400, and a control logic circuit 210.

The second ECC engine 400 may be enabled or disabled under control of the control logic circuit 210. When the second ECC engine 400 is enabled, the second ECC engine 400 performs an ECC encoding on the main data MD received from the memory controller 100 to generate parity data using one of a plurality of ECCs and performs an ECC decoding on the main data MD read from the memory cell array 300 to correct at least one error bit in the main data MD. The second ECC engine 400 may selectively perform the ECC encoding and the ECC decoding based on an importance degree of the main data MD. Therefore, the semiconductor memory device 200 may store the sub data SDT in a parity cell region of the memory cell array 300 and may increase usability of the parity cell region.

Figure 3:
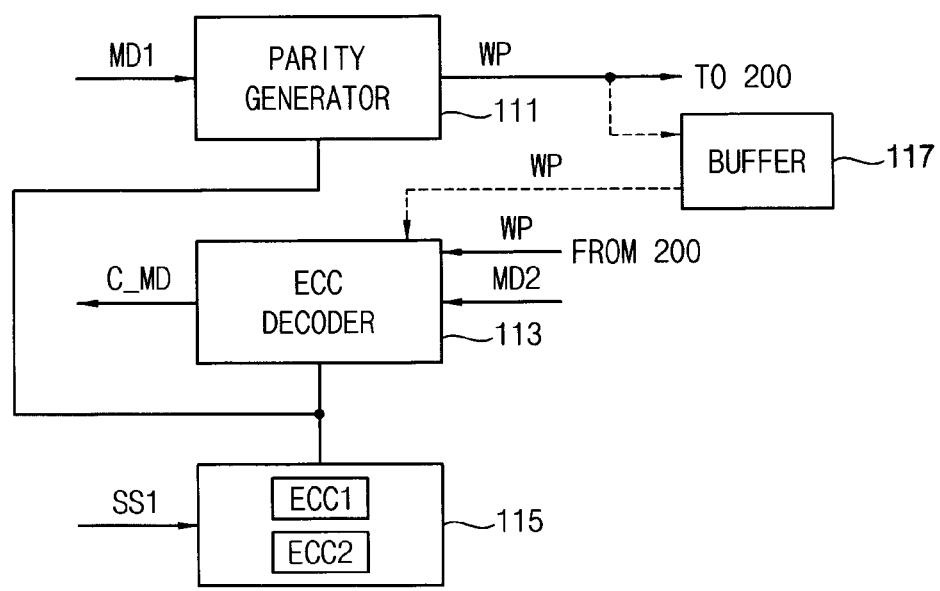
FIG. 3 is a block diagram illustrating an example of the first ECC engine in the memory controller in FIG. 2 according to example embodiments.

FIG. 3 is a block diagram illustrating an example of the first ECC engine in the memory controller in FIG. 2 according to example embodiments.

Referring to FIG. 3, the first ECC engine 110 may include a parity generator 111, an ECC decoder 113, a storage circuit 115 and a buffer 117. The storage circuit 115 may store a plurality of ECCs EEC1 and ECC2 and may provide the parity generator 111 and the ECC decoder 113 with one of the plurality of ECCs EEC1 and ECC2 in response to a selection signal SS1 from the CPU 120.

The parity generator 111 may generate the write parity data WP by performing an ECC encoding on main data MD1 to be sent to the semiconductor memory device 200, by using the one of the plurality of ECCs EEC1 and ECC2. The write parity data WP may be transmitted to the semiconductor memory device 200 or may be stored in the buffer 117.

The ECC decoder 113 performs an ECC decoding on main data MD2 received from the semiconductor memory device 200 by one of the plurality of ECCs EEC1 and ECC2 and the write parity data WP, corrects at least one error bit in the main data MD2 and outputs a corrected main data C_MD. The write parity data WP may be received from either the buffer 117 or the semiconductor memory device 200. The ECC decoder 113 provides the corrected main data C_MD to the host.

Referring back to FIG. 2, the memory controller 100 may generate the write parity data WP using one of the plurality of ECCs EEC1 and ECC2 based on an importance degree of the main data MD to be sent to the semiconductor memory device 200.

The memory controller 100 may transmit the command CMD to the semiconductor memory device 200 after the memory controller 100 incorporates ECC levels indicating an importance degree of the main data MD in the command CMD.

The semiconductor memory device 200 determines the importance degree of the main data MD by decoding the command CMD and may provide the second ECC engine 400 with a control signal designating an error correction mode corresponding to the importance degree of the main data MD.

Figure 4:
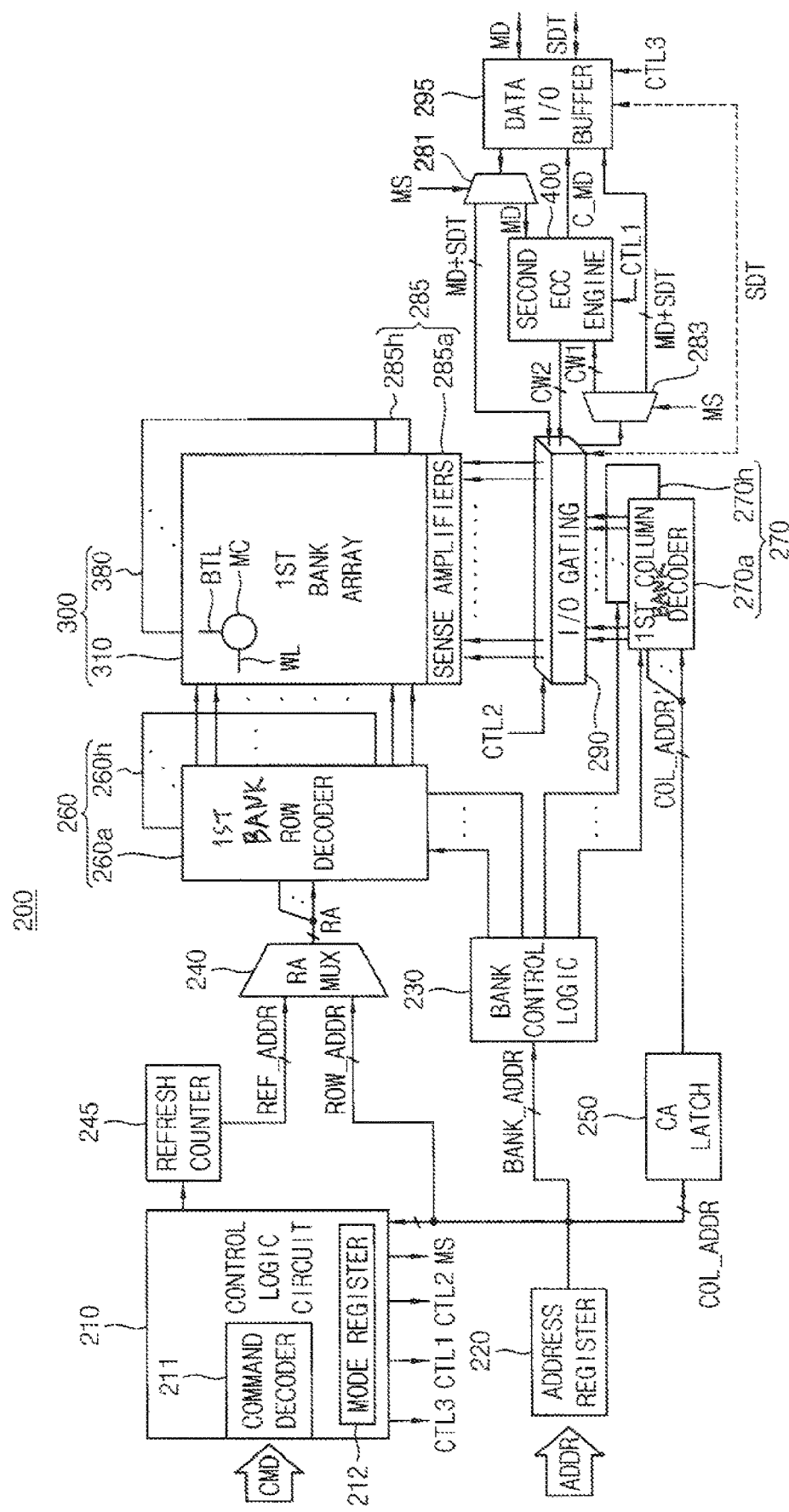
FIG. 4 is a block diagram illustrating the semiconductor memory device in the memory system of FIG. 2 according to example embodiments.

FIG. 4 is a block diagram illustrating the semiconductor memory device in the memory system of FIG. 2 according to example embodiments.

Referring to FIG. 4, the semiconductor memory device 200 includes the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, the second ECC engine 400, a first path selection circuit 281, a second path selection circuit 283, and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a-285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In some embodiments, in a burst mode, the column address latch 250 generates column addresses COL_ADDR' that increment from the received column address COL_ADDR. The column address latch 250 applies the temporarily stored or generated column address COL_ADDR' to the first through eighth bank column decoders 270a~270h.

The activated one of the first through eighth bank column decoders 270a~270h activates a sense amplifier corresponding to the bank address BANK_ADDR and the column address COL_ADDR' through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

Data read from one bank array of the first through eighth bank arrays 310~380 is sensed by a sense amplifier coupled to the one bank array from which the data is to be read, and is stored in the read data latches. The data stored in the read data latches may be provided to the memory controller 100 via the data I/O buffer 295 after ECC decoding is selectively performed by the second ECC engine 400 based on an error correction mode.

The main data MD to be written in one bank array of the first through eighth bank arrays 310~380 may be provided to the data I/O buffer 295 from the memory controller 100. The data I/O buffer 295 may selectively provide the main data MD to the second ECC engine 400 based on the error correction mode. In a first error correction mode, the main data MD may be written in the one bank array through the write drivers without going through the second ECC engine 400. In a second error correction mode, the main data MD is encoded to a codeword CW2 by the second ECC engine 400. The codeword CW2 may be written in the one bank array through the write drivers. Bits obtained by adding the main data bits MD and the parity bits PRT may be referred to herein as a 'codeword'.

The data I/O buffer 295 may provide the main data MD from the memory controller 100 to the first path selection circuit 281 in a write operation of the semiconductor memory device 200, and may provide the main data MD from the second ECC engine 400 or the second path selection circuit 283 to the memory controller 100 in a read operation of the semiconductor memory device 200.

The first path selection circuit 281 may provide the main data MD and the sub data SDT to the I/O gating circuit 290 in response to a mode signal MS in the first error correction mode. The first path selection circuit 281 may provide the main data MD to the second ECC engine 400 in response to the mode signal MS in the second error correction mode.

The second path selection circuit 283 may provide the main data MD and the sub data SDT from the I/O gating circuit 290 to the data I/O buffer 295 in response to the mode signal MS in the first error correction mode. The second path selection circuit 283 may provide the codeword CW1 from the I/O gating circuit 290 to the second ECC engine 400 in response to the mode signal MS in the second error correction mode. In the second error correction mode, if an error bit occurs in the main data MD of the codeword CW1, the main data MD of the codeword CW1 may be corrected by the second ECC engine 400 and the second ECC engine 400 may provide corrected main data C_MD to the data I/O buffer 295 to be subsequently output by the semiconductor memory device 200.

In addition, the data I/O buffer 295 may be directly coupled to the I/O gating circuit 290. The data I/O buffer 295 may provide the sub data SDT to the I/O gating circuit 290 or may receive the sub data SDT from the I/O gating circuit 290 in response to a third control signal CTL3 from the control logic circuit 210 in the second error correction mode.

The control logic circuit 210 may control operations of the semiconductor memory device 200. For example, the control logic circuit 210 may generate control signals for the semiconductor memory device 200 in order to perform a write operation or a read operation.

The control logic circuit 210 includes a command decoder 211 that decodes the command CMD received from the memory controller 100 and a mode register 212 that sets an operation mode of the semiconductor memory device 200. For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the second ECC engine 400, a second control signal CTL2 to control the I/O gating circuit 290, a third control signal CTL3 to control the data I/O buffer 295. In addition, the control logic circuit 210 generates the mode signal MS by decoding the command CMD and provides the mode signal MS to the first path selection circuit 281 to the second path selection circuit 283. The mode signal MS may have a logic level which is based on the degree of the main data MD.

Figure 5:
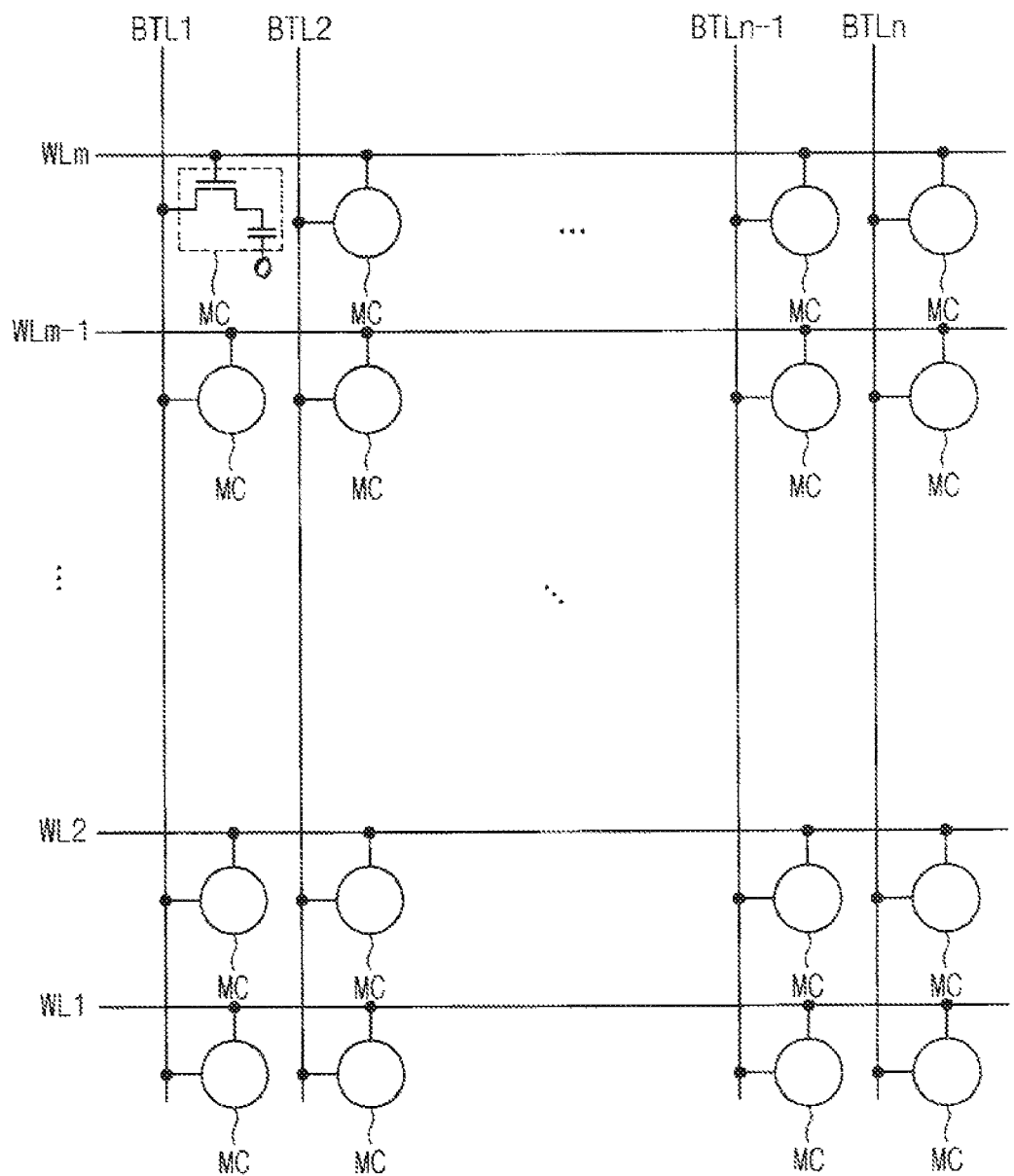
FIG. 5 illustrates an example of the first bank array in the semiconductor memory device of FIG. 4.

FIG. 5 illustrates an example of the first bank array in the semiconductor memory device of FIG. 4.

Referring to FIG. 5, the first bank array 310 includes a plurality of word-lines WL1~WLm (m is a natural number greater than two), a plurality of bit-lines BTL1~BTLn (n is a natural number greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor. Each of the memory cells MCs includes a dynamic memory cell or a DRAM cell.

Figure 6:
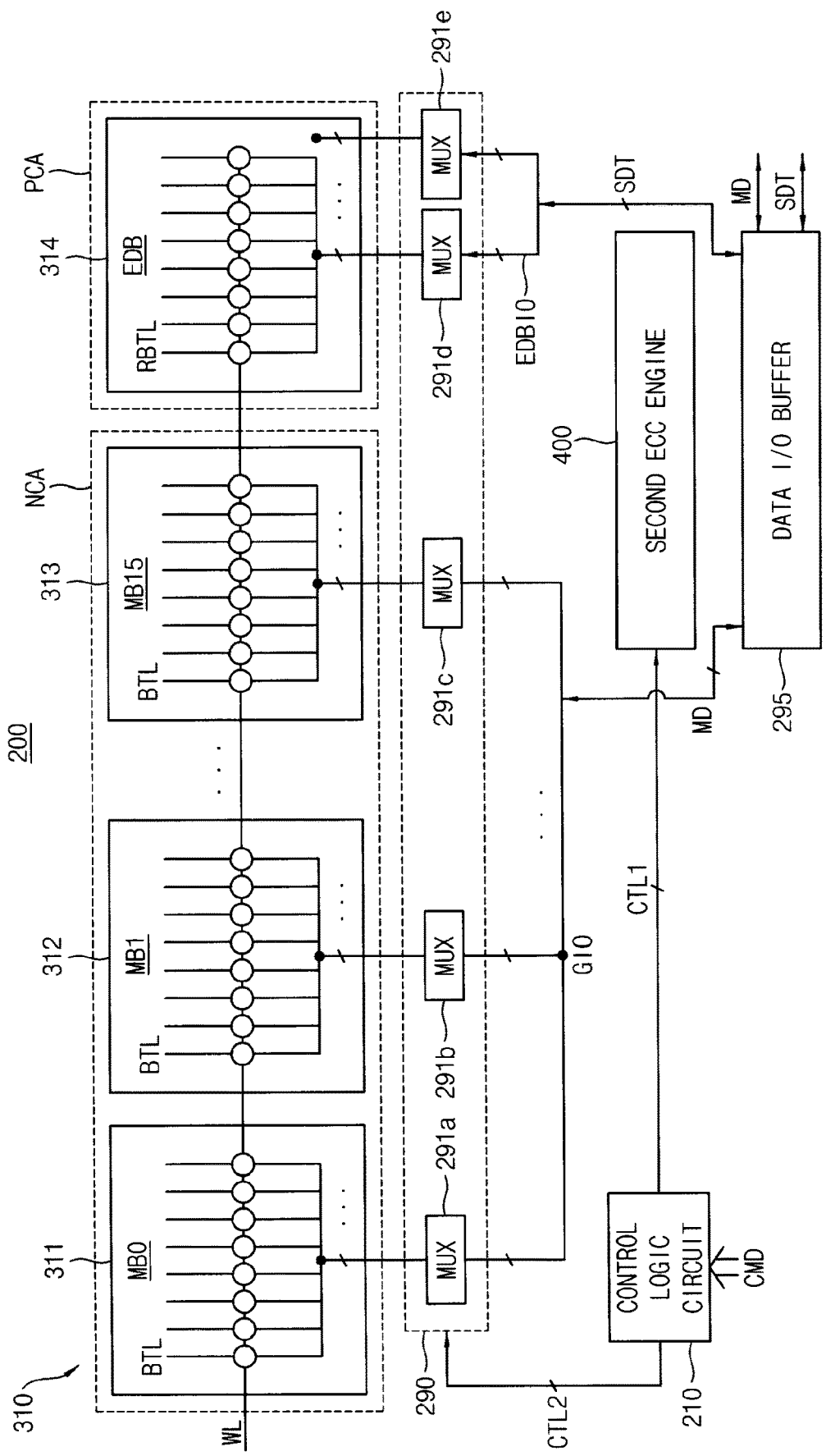
FIG. 6 illustrates a portion of the semiconductor memory device of FIG. 4 in a first error correction mode according to example embodiments.

FIG. 6 illustrates a portion of the semiconductor memory device of FIG. 4 in a first error correction mode according to example embodiments.

In FIG. 6, the control logic circuit 210, the first bank array 310, the I/O gating circuit 290, the second ECC engine 400 and the data I/O buffer 295 are illustrated. In FIG. 6, the first path selection circuit 281 and the second path selection circuit 283 are not illustrated for convenience of explanation.

Referring to FIG. 6, the first bank array 310 includes a normal cell region (i.e., a normal cell array) NCA and a parity cell region (i.e., a parity cell array) PCA.

The normal cell region NCA includes a plurality of first memory blocks MB0~MB15, i.e., 311~313, and the parity cell region PCA includes at least a second memory block 314. The first memory blocks 311~313 are externally addressable memory blocks of the semiconductor memory device 200 and may determine the memory capacity of the semiconductor memory device 200 as viewed by an external device (such as the memory controller 100). The second memory block 314 is for sub data SDT. Since the second memory block 314 is used for sub data SDT to repair error bits generated from the memory controller 100, the second memory block 314 is also referred to as an extended data bus (EDB) block. The second memory block 314 may also be used as redundant memory to be substituted for sections of memory of the first memory blocks 311~313 that have been determined to have defective memory cells (which may be referred to herein as 'failed cells'). Although only one word line WL connected to one row of memory cells is illustrated in FIG. 6, the first memory blocks MB0~MB15 and second memory block(s) 314 may comprise with a plurality of rows of memory cells connected to a plurality of corresponding word lines WL. In addition, each word line WL may connect to a row of memory cells that is formed in first memory blocks MB0~MB15 and second the memory block(s) 314 (e.g., as shown in FIG. 6) so that all of these memory cells may be accessed by activating the word line WL (e.g., activated and accessed by decoding a single row address).

In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291*a*~291*e* respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible.

The second ECC engine 400 may be connected to the switching circuits 291*a*~291*e* through first data lines GIO and second data lines EDBIO.

The control logic circuit 210 may decode the command CMD to generate the second control signal CTL2 for controlling the switching circuits 291*a*~291*e* and the first control signal CTL1 for controlling the second ECC engine

400. The second ECC engine 400 may be disabled in response to the first control signal CTL1 in the first error correction mode.

The data I/O buffer 295 may store the main data MD in the normal cell region NCA through the switching circuits 291a~291c or may read the main data MD from the normal cell region NCA through the switching circuits 291a~291c in the first error correction mode. In addition, the data I/O buffer 295 may store the sub data SDT in the parity cell region PCA through the switching circuits 291d and 291e or may read the sub data SDT from the parity cell region PCA through the switching circuits 291d and 291e in the first error correction mode.

Figure 7:
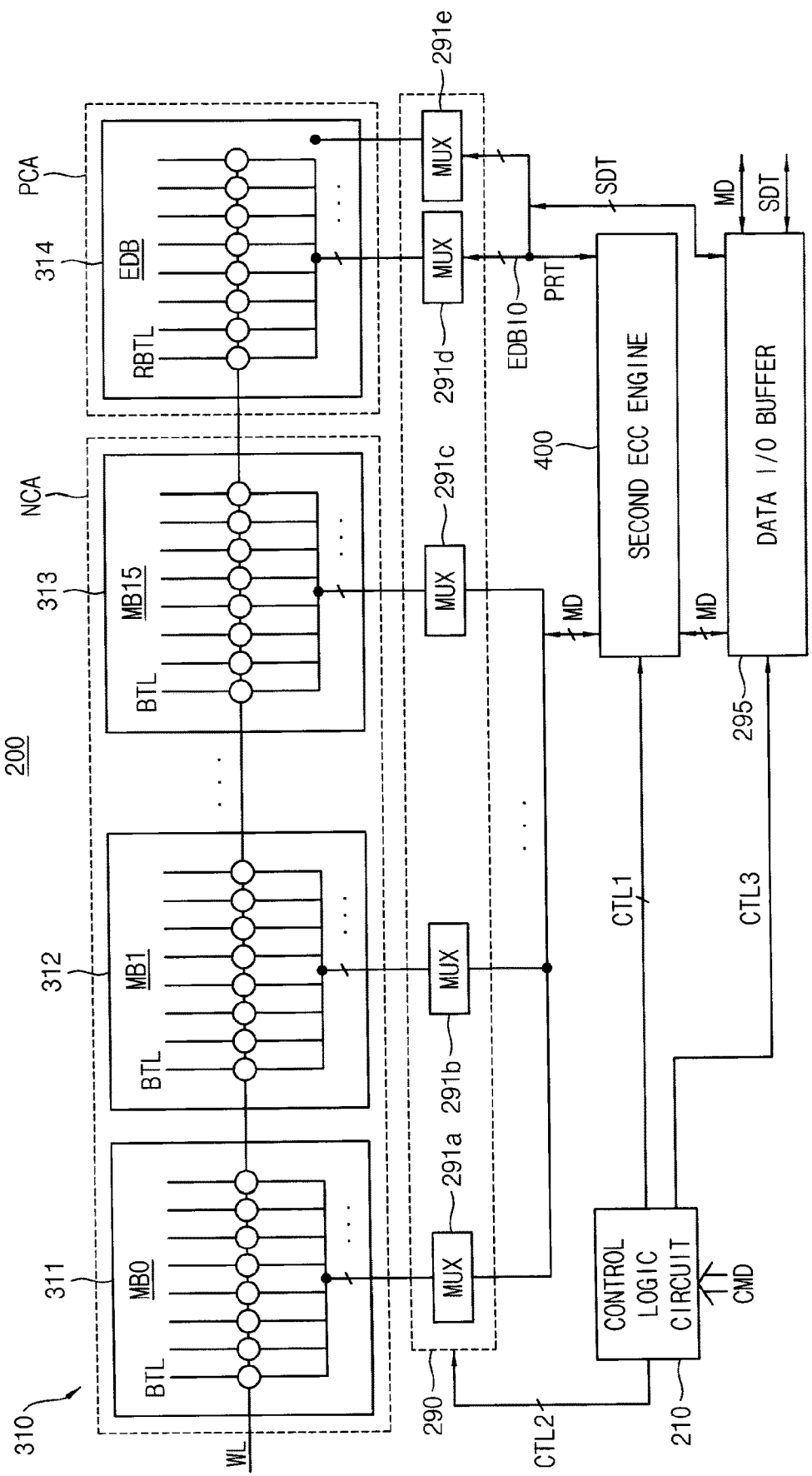
FIG. 7 illustrates a portion of the semiconductor memory device of FIG. 4 in a second error correction mode according to example embodiments.

FIG. 7 illustrates a portion of the semiconductor memory device of FIG. 4 in a second error correction mode according to example embodiments.

In FIG. 7, the control logic circuit 210, the first bank array 310, the I/O gating circuit 290, the second ECC engine 400 and the data I/O buffer 295 are illustrated. In FIG. 7, the first path selection circuit 281 and the second path selection circuit 283 are not illustrated for convenience of explanation.

Referring to FIG. 7, the second ECC engine 400 is enabled in response to the first control signal CTL1.

The second memory block 314 is for ECC and/or redundancy repair. Since the second memory block 314 is used for ECC and/or redundancy repair, the second memory block 314 is also referred to as the EDB block used for ECC repair, data line repair and/or block repair to repair failed cells generated in the first memory blocks 311~313.

The data I/O buffer 295 may provide the main data MD to the second ECC engine 400 or may receive the main data MD from the second ECC engine 400. In addition, the data I/O buffer 295 may store the sub data SDT in the parity cell region PCA through the switching circuits 291d and 291e or may read the sub data SDT from the parity cell region PCA through the switching circuits 291d and 291e in response to the third control signal CTL3 in the second error correction mode.

In addition, in a write operation, the second ECC engine 400 may generate a parity data PRT based on the main data MD, may provide the main data MD to the normal cell region NCA through the switching circuits 291a~291c and may provide the parity data PRT to the parity cell region PCA through the switching circuits 291d and 291e. In this case, the second ECC engine 400 may generate the parity data PRT using a single error correction (SEC) ECC.

In example embodiments, in the write operation, the second ECC engine 400 may provide the parity data PRT to a first sub parity region SRG1 (shown in FIG. 16) of the parity cell region PCA through the switching circuit 291d. The data I/O buffer 295 may store the sub data SDT in a second sub parity region SRG2 (shown in FIG. 16) of the parity cell region PCA through the switching circuit 291e.

In addition, in a read operation, the second ECC engine 400 may perform an ECC decoding on the main data MD based on the parity data PRT. In addition, the I/O gating circuit 290 may provide the sub data SDT read from the parity cell region PCA to the data I/O buffer 295 through the switching circuits 291d and 291e.

In example embodiments, in the read operation, the second ECC engine 400 may perform an ECC decoding on the main data MD based on the parity data PRT read from the first sub parity region SRG1 of the parity cell region PCA through the switching circuit 291d. The I/O gating circuit 290 may provide the sub data SDT read from the second sub parity region SRG2 of the parity cell region PCA through the switching circuit 291e.

Figure 8:
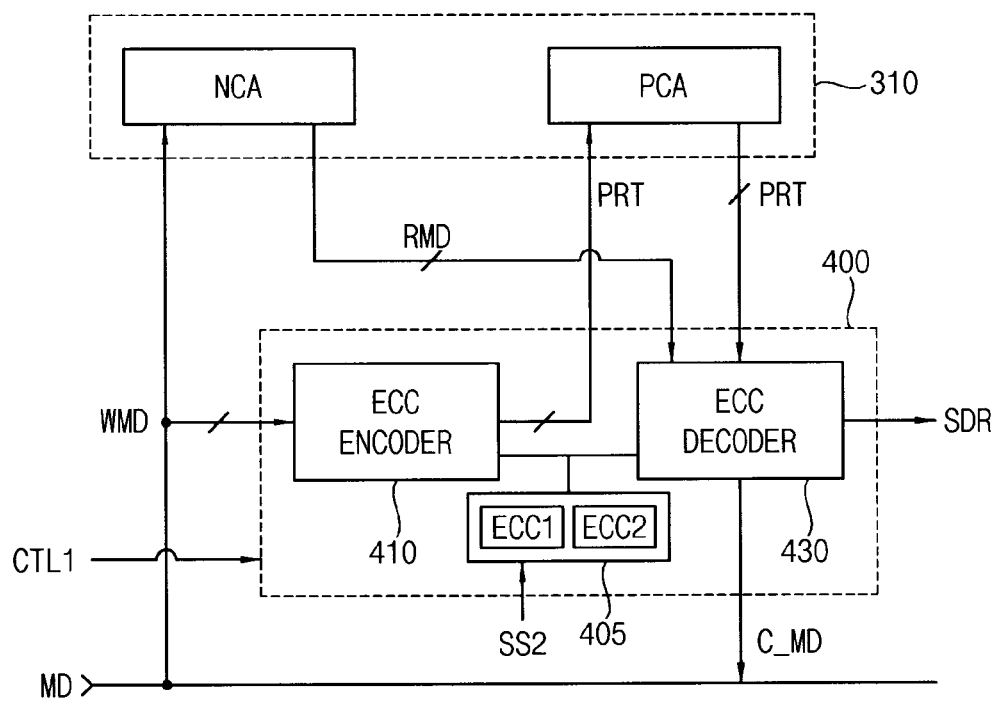
FIG. 8 is a block diagram illustrating an example of the second ECC engine in the semiconductor memory device of FIG. 4 according to example embodiments.

FIG. 8 is a block diagram illustrating an example of the second ECC engine in the semiconductor memory device of FIG. 4 according to example embodiments.

Referring to FIG. 8, the second ECC engine 400 includes an ECC encoder 410, an ECC decoder 430 and a storage circuit 405. The storage circuit 405 may store a plurality of ECCs ECC1 and ECC2 and may provide one of the plurality of ECCs ECC1 and ECC2 to the ECC encoder 410 and the ECC decoder 430 in response to a selection signal SS2 of the first control signal CTL1. A first ECC ECC1 may provide a double error correction (DEC) and a second ECC ECC2 may provide a single error correction SEC.

The ECC encoder 410 may generate parity data PRT associated with a write data WMD to be stored in the normal cell region NCA of the first bank array 310. The parity data PRT may be stored in the parity cell region PCA of the first bank array 310.

The ECC decoder 430 may perform the decoding on a read data RMD read from the first bank array 310 based on the read data RMD and the parity data PRT. When the read data RMD includes at least one error bit based on a result of the ECC decoding, the ECC decoder 430 corrects the at least one error bit based on a syndrome SDR and may transmit the syndrome SDR to the memory controller 100 via the data I/O buffer 295. For example, if the read data RMD includes at least one error bit a bit of the syndrome SDR represents "1" and if the read data RMD includes no error bit the bit of the syndrome SDR represents "0."

Figure 9:
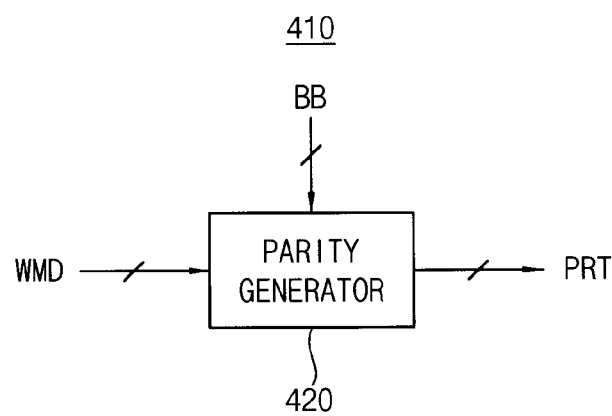
FIG. 9 illustrates an example of the ECC encoder in the second ECC engine of FIG. 8 according to example embodiments.

FIG. 9 illustrates an example of the ECC encoder in the second ECC engine of FIG. 8 according to example embodiments.

Referring to FIG. 9, the ECC encoder 410 may include a parity generator 420. The parity generator 420 receives the write data WMD and basis bit BB and generates the parity data PRT by performing, for example, an XOR array operation. The basis bit BB is bits for generating the parity data PRT with respect to the write data WMD. When the parity data PRT includes 8-bit, the basis bit BB may include b'0000000. The basis bit BB may include other particular bits instead of b'0000000.

Figure 10:
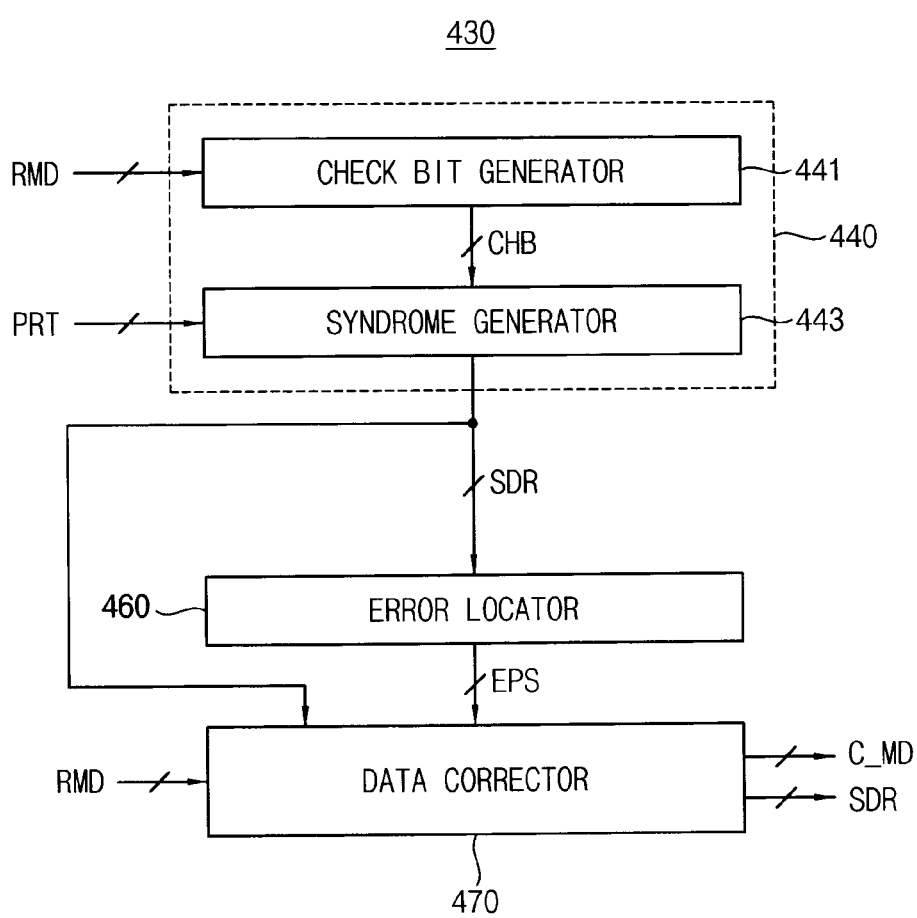
FIG. 10 illustrates an example of the ECC decoder in the second ECC engine of FIG. 8 according to example embodiments.

FIG. 10 illustrates an example of the ECC decoder in the second ECC engine of FIG. 8 according to example embodiments.

Referring to FIG. 10, the ECC decoder 430 may include a syndrome generation circuit 440, an error locator 460 and a data corrector 470. The syndrome generation circuit 440 may include a check bit generator 441 and a syndrome generator 443.

The check bit generator 441 generates check bits CHB based on the read data RMD by performing an XOR array operation and the syndrome generator 443 generates the syndrome SDR by comparing corresponding bits of the parity data PRT and the check bits CHB.

The error locator 460 may generate an error position signal EPS indicating a position of at least one error bit in the read data RMD by decoding the syndrome SDR when all bits of the syndrome SDR are not zero. The error locator 460 provides the error position signal EPS to the data corrector 470.

The data corrector 470 receives the read data RMD, corrects the at least one error bit in the read data RMD based on the error position signal EPS when the read data RMD includes at least one error bit and outputs the corrected main data C_MD. In addition, the data corrector 470 receives the syndrome SDR and provides the syndrome SDR to the data I/O buffer 295 when the error position signal EPS indicates that the read data RMD includes at least one error bit.

Figure 11:
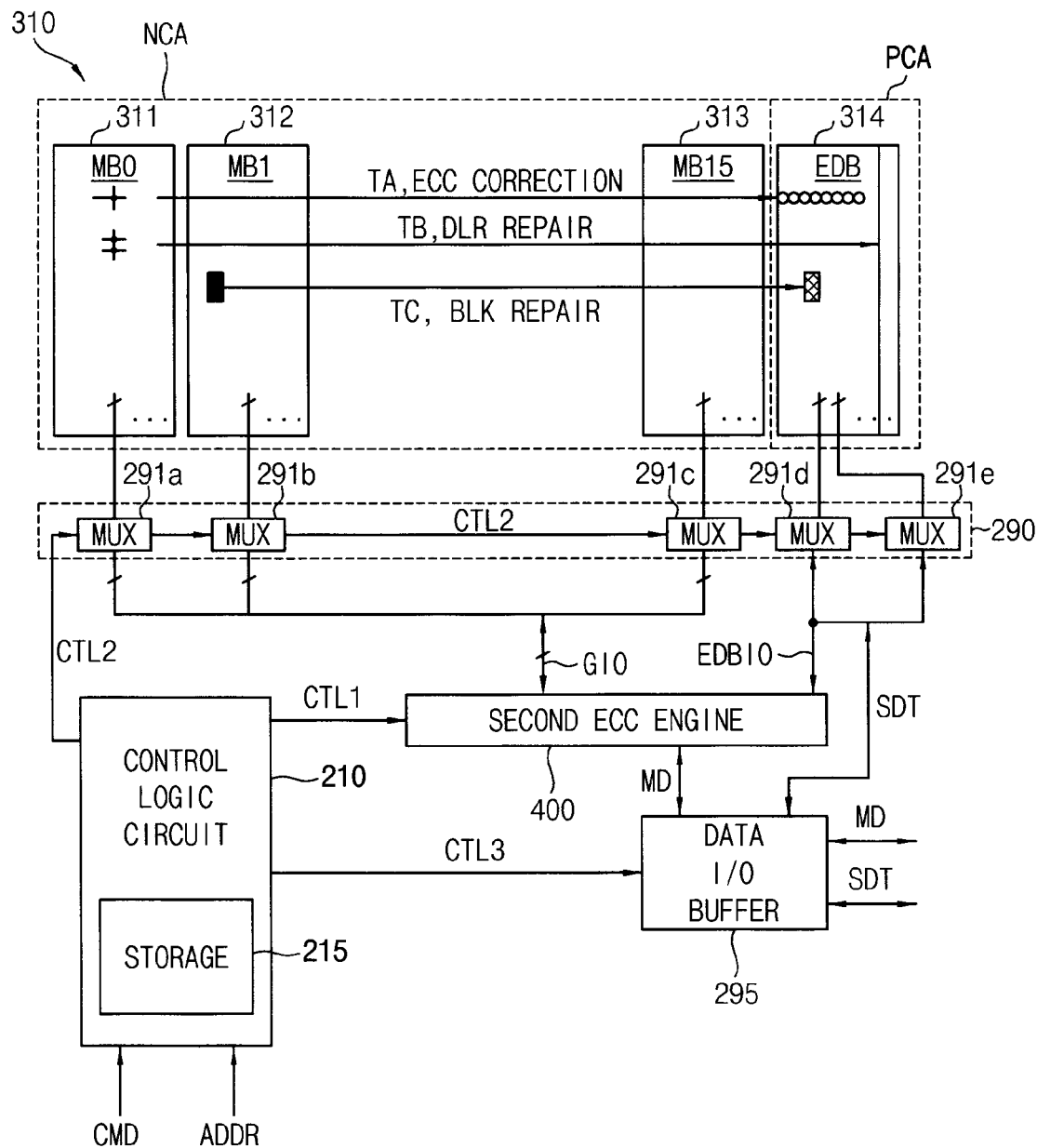
FIG. 11 illustrates another example of a portion of the semiconductor memory device of FIG. 4 according to example embodiments.

FIG. 11 illustrates another example of a portion of the semiconductor memory device of FIG. 4 according to example embodiments.

Referring to FIG. 11, the control logic circuit 210 may include a failed address storage 215.

The second ECC engine 400 may share ECC operation and a redundancy repair operation.

Advancements in semiconductor manufacturing technology have led to an increase in the memory capacity of a DRAM device. As a microfabrication process technology has advanced, the number of defective memory cells may be increased. Failed memory cells may include defective cells and weak cells.

The defective cells are hardware-defective. That is, the defective cells are memory cells that do not operate due to a defect in a manufacturing process, e.g., memory cells in which a disconnection or short of a wiring occurred. The weak cells are software-defective. That is, the weak cells are memory cells that are defective under a specific voltage condition or specific operation timing. Examples of weak cells may include cells that deteriorate in terms of their characteristics, e.g., a cell having a short refresh duration, a cell having a degraded cell write performance or a variable retention time, etc. To secure the manufacturing yield, failed memory cells are repaired by replacing them with redundant memory cells.

Data stored in the first memory blocks 311, 312, and 313 may be input and output via corresponding data I/O pads.

The control logic circuit 210 includes the failed address storage 215 that stores failed addresses addressing failed memory cells in the semiconductor memory device 200. The failed address storage 215 may be implemented, for example, with an anti-fuse array, a content addressable memory (CAM), a register, or a memory device such as a static random access memory (SRAM).

Failed addresses that are stored in the failed address storage 215 may be classified based on types of fails according to error bits included in data that are read from the normal cell region NCA. In the first memory blocks 311, 312, and 313 in the normal cell region NCA, data may be read from memory cells per one unit. The parity data PRT may be used for an ECC operation for detecting at least one error bit with respect to data bits stored in the first memory blocks 311, 312, and 313 and correcting a detected error bit.

Fails corresponding to failed addresses that are stored in the failed address storage 215 may be classified into a type in which the number of error bits in one codeword is one, a type in which the number of error bits in one codeword is two, and a type in which the number of error bits in one codeword is three or more. The type in which the number of error bits in one codeword is three or more may be regarded as a block fail. In an exemplary embodiment, when the number of error bits in one codeword is one, the second memory block 314 is used for ECC (refer to TA of FIG. 11). When the number of error bits in one codeword is larger than a certain number, such as two or more (the number depends on the implemented ECC encoding scheme), failed cells may not be able to be repaired by an ECC operation. Thus, in one embodiment, when the number of error bits in one codeword is two, the second memory block 314 is used for data line repair (refer to TB of FIG. 11). When the number of error bits in one codeword is three or more, that is, a block fail occurs, the second memory block 314 is used for block repair (refer to TC of FIG. 11).

The control logic circuit 210 determines whether the address ADDR that is applied from the memory controller 100 is the same as a fail address stored in the fail address storage 215. The control logic circuit 210 compares failed addresses, which are stored in the failed address storage 215 according to types of failed cells, i.e., a single-bit error in one codeword, a two-bit error in one codeword, and a three or more-bit error in one codeword (i.e., a block fail), to the address ADDR applied from the memory controller 100, and generates first through third control signals CTL1, CTL2 and CTL3.

The control logic circuit 210 provides the second control signal CTL2 to the switching circuits 291a, 291b, 291c, 291d and 291e and provides the first control signal CTL1 to the second ECC engine 400. The first control signal CTL1 and the second control signal CTL2 control the switching circuits 291a, 291b, 291c, 291d and 291e and the second ECC engine 400 to selectively perform an ECC operation or a redundancy repair operation according to types of failed cells occurring in the normal cell region NCA.

The control logic circuit 210 controls the switching circuits 291d and 291e such that the sub data SDT is to be stored in the parity cell region PCA in the second error correction mode.

FIG. 12 is a diagram for describing ECC levels according to data bits of the main data and parity bits of the parity data.

In FIG. 12, SEC represents single error correction, DED represents double error detection and DEC represents double error correction. FIG. 12 illustrates parity bits and corresponding size overheads of the parity bits (PARITY O/H). The parity bits correspond to a Hamming code or an extended Hamming code. The size overhead of the parity bits correspond to a ratio of the parity bits of the parity data corresponding to the write data to the data bits of the write data. The cases in FIG. 12 are non-limiting examples and example embodiments may be applied to other various cases. For example, the parity bit number and the size overhead may be determined differently if Bose-Chaudhuri-Hocquenghem (BCH) code, Redd-Solomon code, etc. are used.

As illustrated in FIG. 12, as the parity bit number is increased with respect to the same data bit number, that is, as the ratio of the parity bit number to the data bit number is increased, capability of error detection and correction is increased. As the data bit number is increased with respect to the same capability of error detection and correction, the corresponding parity bit number is increased but the ratio of the parity bit number to the data bit number is decreased.

As such, the error detection capability and/or the error correction capability may be increased as the ratio of the parity bit number to the corresponding data bit number is increased. As a result, the ECC level may be raised as the ratio of the parity bit number to the corresponding data bit number is increased.

A fixed ECC level is applied in case of conventional schemes without regard to the importance degree of data. In this case, memory resources may be wasted and a size of the semiconductor memory device may be increased if the ECC level is set higher than necessary. In contrast, the error detection and correction capability may be degraded and performance of the semiconductor memory device may be degraded if the ECC level is set lower than necessary.

The semiconductor memory device according to example embodiments may adaptively set ECC levels depending on an importance degree of write data to use the parity cell region to store data which the memory controller 100 generates. For example, the memory controller 100 may generate one of write parity data WP which the first ECC engine 110 generates and configuration data (setting data) CDT associated with configuration (or setting) of the semiconductor memory device 200. Therefore, the semiconductor memory device may increase usability of eh parity cell region to reduce a size overhead of the parity cell region.

FIGS. 13 through 18 illustrate examples of data transmission in the memory system of FIG. 2 based on an error correction mode according to example embodiments, respectively.

In FIGS. 13 through 18, the parity cell region PCA includes a first sub parity region SRG1 and a second sub parity region SRG2. It is assumed that the second ECC engine 400 performs an ECC decoding based on one of DEC ECC and SEC ECC.

Figure 13:
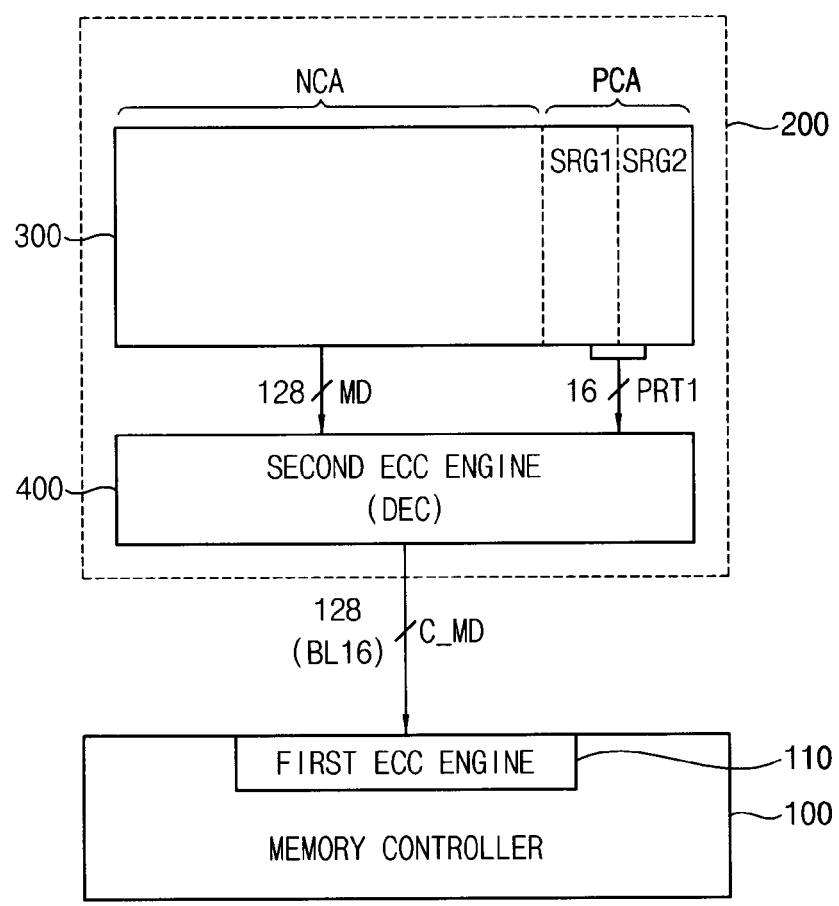
FIGS. 13 through 18 illustrate examples of data transmission in the memory system of FIG. 2 based on an error correction mode according to example embodiments, respectively.

FIG. 13 illustrates the memory system of FIG. 2 in a third error correction mode.

Referring to FIG. 13, in the third error correction mode, 128-bit main data MD is stored in the normal cell region NCA and 16-bit parity data PRT1 is stored in the parity cell region PCA. In this case, the parity cell region PCA only stores the parity data PRT1. The second ECC engine 400 performs an ECC decoding on the main data MD based on the 16-bit parity data PRT1 to provide the corrected main data C_MD to the first ECC engine 110 in the memory controller 100 through 16 burst lengths BL16.

Figure 14:
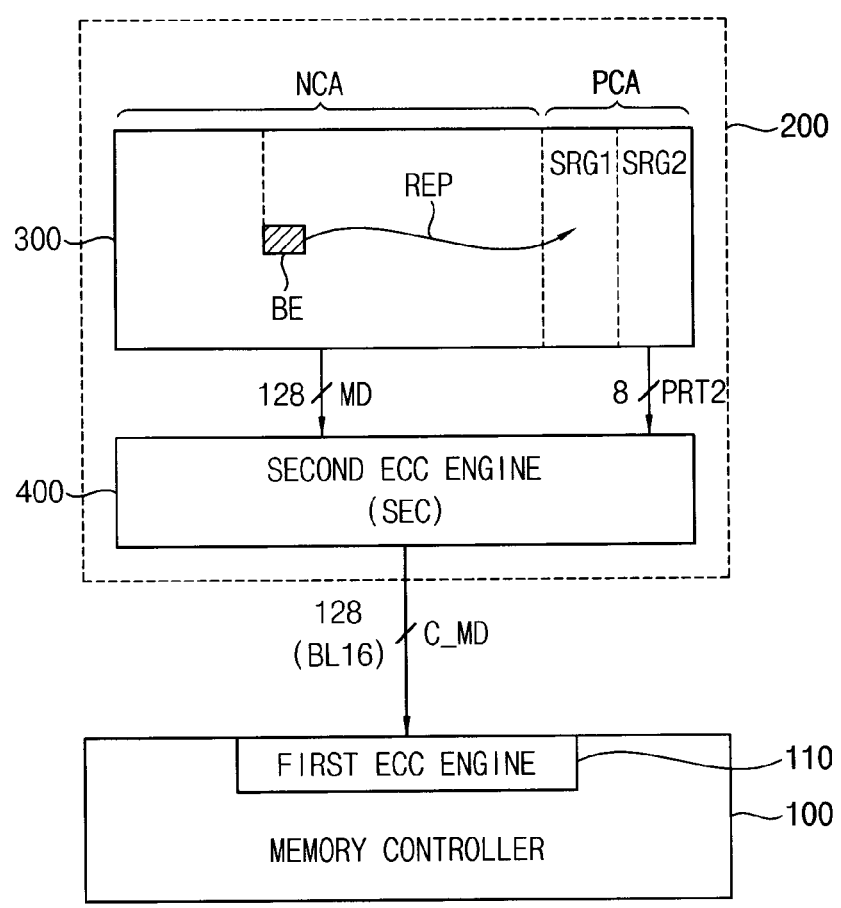

FIG. 14 illustrates the memory system of FIG. 2 in a second error correction mode.

Referring to FIG. 14, in the second error correction mode, 128-bit main data MD is stored in the normal cell region NCA and 8-bit parity data PRT2 is stored in the second sub parity region SRG2. The first sub parity region SRG1 is used for repairing REP a block error BE in the main data MD. The second ECC engine 400 performs an ECC decoding on the main data MD based on the 8-bit parity data PRT2 to provide the corrected main data C_MD to the first ECC engine 110 in the memory controller 100 through 16 burst lengths BL16.

Figure 15:
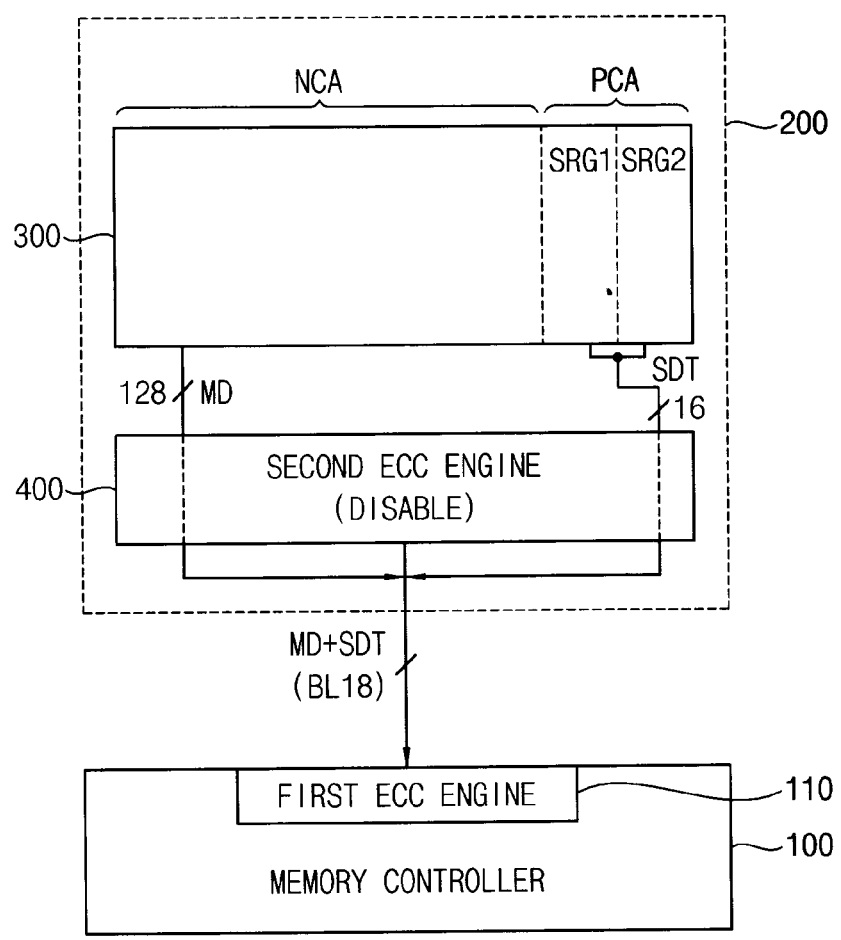

FIG. 15 illustrates the memory system of FIG. 2 in a first error correction mode.

Referring to FIG. 15, in the first error correction mode, the second ECC engine 400 is disabled, 128-bit main data MD is stored in the normal cell region NCA and 16-bit sub data SDT is stored in the parity cell region PCA. In this case, the parity cell region PCA only stores the sub data SDT. The main data MD and the sub data SDT are provided to the first ECC engine 110 in the memory controller 100 through 18 burst lengths BL18 without going through the second ECC engine 400. In FIG. 15, the sub data SDT is transmitted to the memory controller 100 after the main data MD is transmitted to the memory controller 100 by adding burst lengths.

Figure 16:
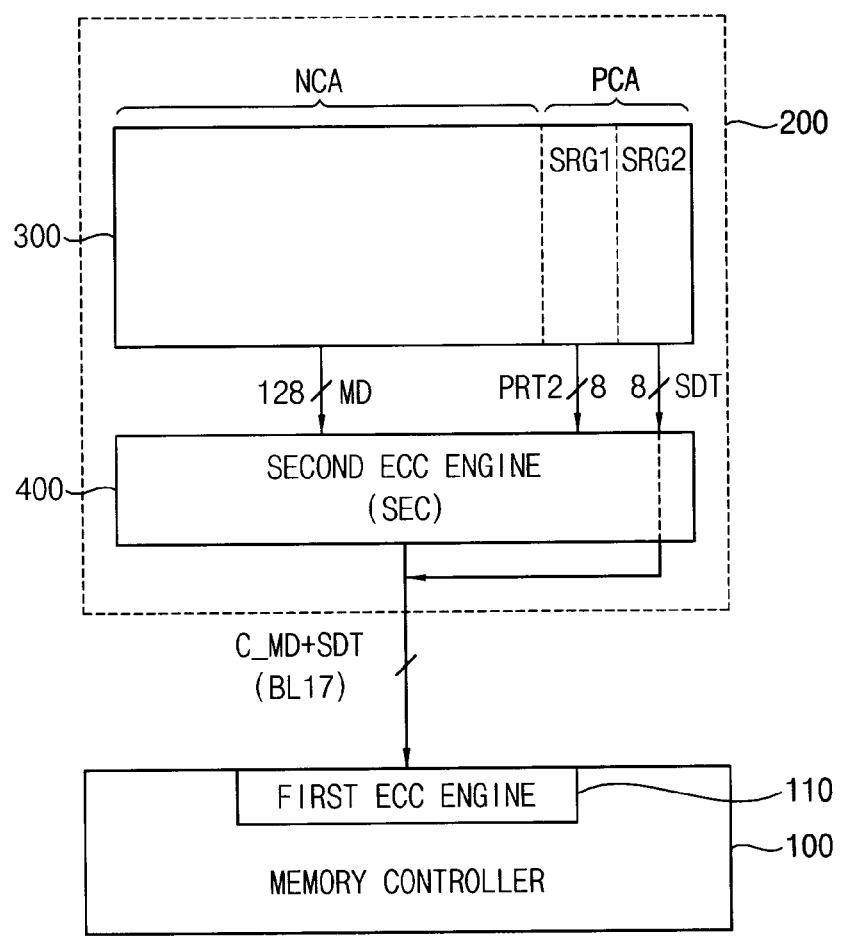

FIG. 16 illustrates the memory system of FIG. 2 in a second error correction mode.

Referring to FIG. 16, in the second error correction mode, 128-bit main data MD is stored in the normal cell region NCA, 8-bit parity data PRT2 is stored in the first sub parity region SRG1 and 8-bit sub data SDT is stored in the second sub parity region SRG2. The second ECC engine 400 performs an ECC decoding on the main data MD based on the 8-bit parity data PRT2 to provide the corrected main data C_MD, and the sub data SDT to the first ECC engine 110 in the memory controller 100 through 17 burst lengths BL17. In FIG. 16, the sub data SDT are transmitted to the memory controller 100 after the corrected main data C_MD is transmitted to the memory controller 100 by adding burst lengths.

Figure 17:
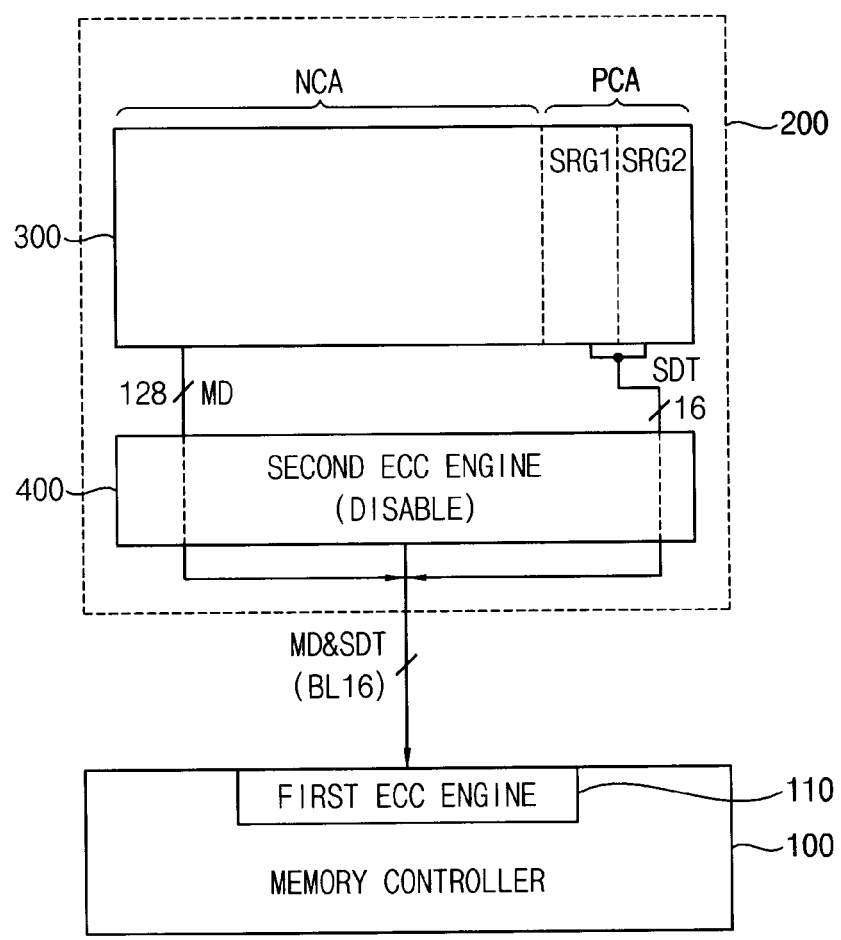

FIG. 17 illustrates the memory system of FIG. 2 in a first error correction mode.

Referring to FIG. 17, in the first error correction mode, the second ECC engine 400 is disabled, 128-bit main data MD is stored in the normal cell region NCA and 16-bit sub data SDT is stored in the parity cell region PCA. In this case, the parity cell region PCA only stores the sub data SDT. The main data MD and the sub data SDT are provided to the first ECC engine 110 in the memory controller 100 through 16 burst lengths 16 without going through the second ECC engine 400. In FIG. 17, the main data MD and the sub data SDT are simultaneously transmitted to the memory controller 100 through a data pin/pad.

Figure 18:
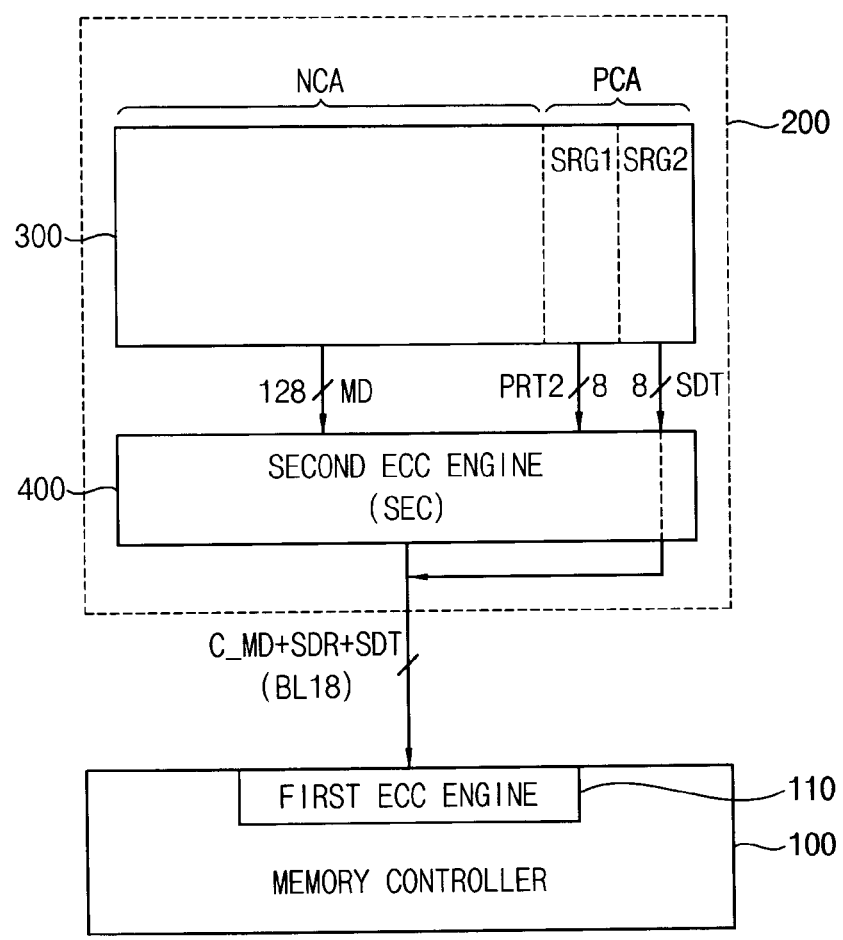

FIG. 18 illustrates the memory system of FIG. 2 in a second error correction mode.

Referring to FIG. 18, in the second error correction mode, 128-bit main data MD is stored in the normal cell region NCA, 8-bit parity data PRT2 is stored in the first sub parity region SRG1 and 8-bit sub data SDT is stored in the second sub parity region SRG2. The second ECC engine 400 performs an ECC decoding on the main data MD based on the 8-bit parity data PRT2 to provide the corrected main data C_MD, the syndrome SDR which is generated by the ECC decoding, and the sub data SDT to the first ECC engine 110 in the memory controller 100 through 18 burst lengths BL18. In FIG. 18, the syndrome SDR and the sub data SDT are transmitted to the memory controller 100 after the corrected main data C_MD is transmitted to the memory controller 100 by adding burst lengths.

In FIGS. 14 through 18, the sub data SDT or the syndrome SDR is transmitted to the memory controller 100 by adding burst lengths or data pins. However, in some example embodiments, the semiconductor memory device 200 may provide the memory controller 100 with extended address space associated with the parity cell region PCA.

Figure 19:
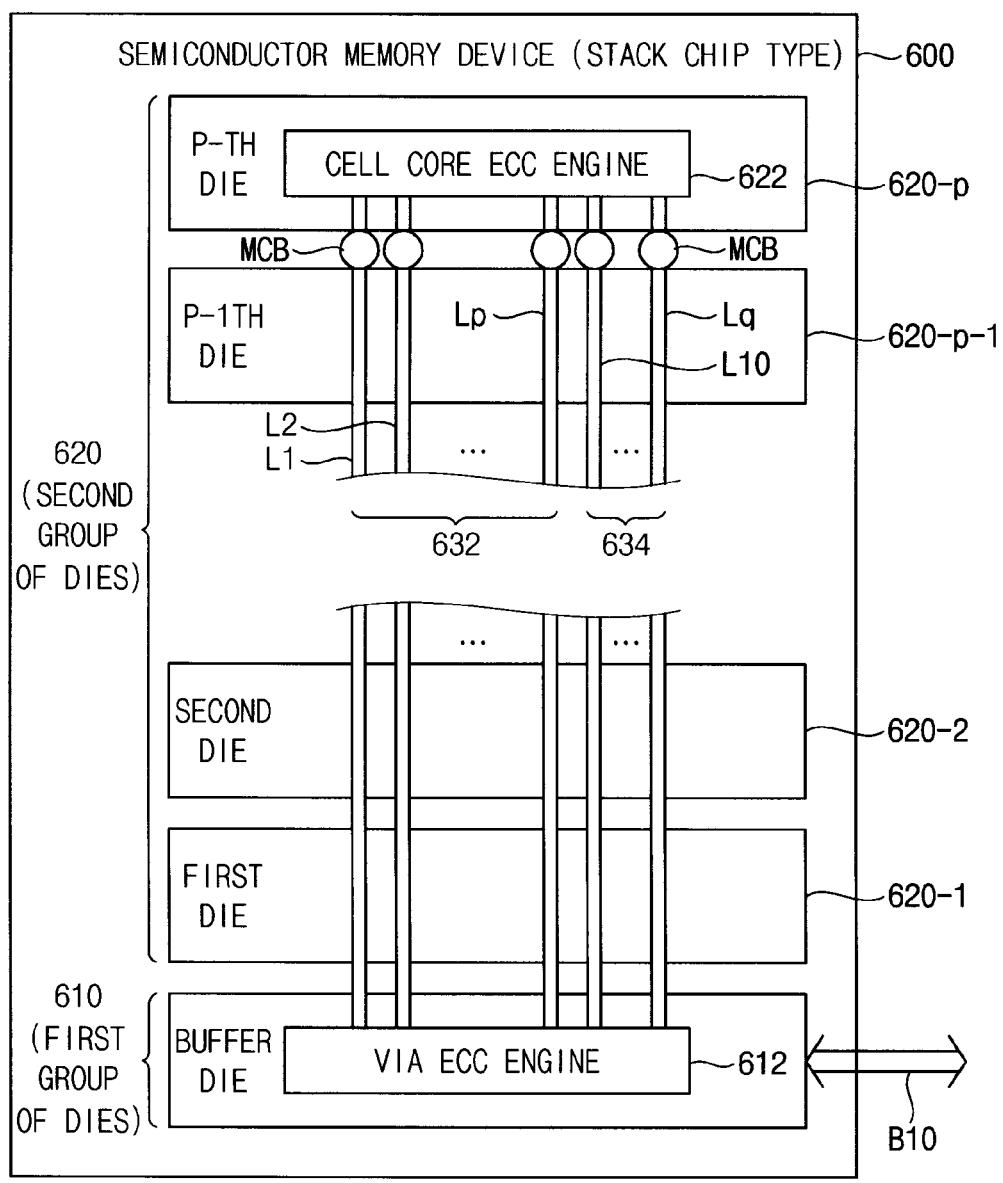
FIG. 19 is a block diagram illustrating a semiconductor memory device according to example embodiments.

FIG. 19 is a block diagram illustrating a semiconductor memory device according to example embodiments.

Referring to FIG. 19, a semiconductor memory device 600 may include a first group of dies 610 and a second group of dies 620 providing a soft error analyzing and correcting function in a stacked chip structure.

The first group of dies 610 may include at least one buffer die. The second group of dies 620 may include a plurality of memory dies 620-1 to 620-p which is stacked on the first group of dies 610 and conveys data through a plurality of through substrate via (or, through silicon via (TSV)) lines. Through substrate vias (TSVs) may fully extend through the entire die in which it is formed or may only partially penetrate the die through the substrate of the die to form a via (electrical) connection from the backside of the die to the upper surface of the substrate (corresponding to the active surface side of the die) on which the integrated circuit is formed. When a TSV is formed in a die formed with a silicon substrate, the TSV may be referred to as a through silicon via.

At least one of the memory dies 620-1 to 620-p may include a first type ECC engine 622 which generates transmission parity bits (i.e., transmission parity data) based on transmission data to be sent to the first group of dies 610. The first type ECC engine 622 may be referred to as 'cell core ECC engine'. The first type ECC engine 622 may employ the second ECC engine 400 of FIG. 8.

The buffer die 610 may include a second type ECC engine 612 which corrects a transmission error using the transmission parity bits when a transmission error is detected from the transmission data received through the TSV liens and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called 'through electrodes'.

As mentioned above, the first type ECC engine 622 may perform an ECC encoding and an ECC decoding based on one of a plurality of ECCs, and at least one of the memory dies 620-1 to 620-$p$ may store sub data which the memory controller generates in at least a portion of a parity cell region.

The first type ECC engine 622 may perform an error correction on data which is outputted from the memory die 620-$p$ before the transmission data is sent.

A transmission error which occurs at the transmission data may be due to noise which occurs at the TSV lines. Since data error due to the noise occurring at the TSV lines may be distinguishable from data error due to a false operation of the memory die, it may be regarded as soft data fail (or a soft error). The soft data fail may be generated due to transmission error on a transmission path, and may be detected and remedied by an ECC operation.

For example, when the transmission data is 128-bit data, the transmission parity bits may be set to 8 bits. However, the scope and spirit of the inventive concepts are not limited thereto. The number of transmission parity bits increases or decreases.

With the above description, a data TSV line group 632 which is formed at one memory die 620-$p$ may include a plurality of TSV lines L1 to Lp, and a parity TSV line group 634 may include a plurality of TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-$p$.

At least one of the memory dies 620-1 to 620-$p$ may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller through the data bus B10.

The first type ECC engine 622, denoted as the cell core ECC engine, may output transmission parity bits as well as the transmission data through the parity TSV line group 634 and the data TSV line group 632 respectively. The outputted transmission data may be data which is error-corrected by the first type ECC engine 622.

The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error on the transmission data using the transmission parity bits. When the transmission error is uncorrectable, the second type ECC engine 612 may output information indicating occurrence of an uncorrectable data error.

When an error is detected from read data in a high bandwidth memory (HBM) or the stacked memory structure, the error is an error occurring due to noise while data is transmitted through the TSV.

According to example embodiments, as illustrated in FIG. 19, the cell core ECC engine 622 may be included in the memory die, the via ECC engine 612 may be included in the buffer die. Accordingly, it may be possible to detect and correct soft data fail. The soft data fail may include a transmission error which is generated due to noise when data is transmitted through TSV lines.

Figure 20:
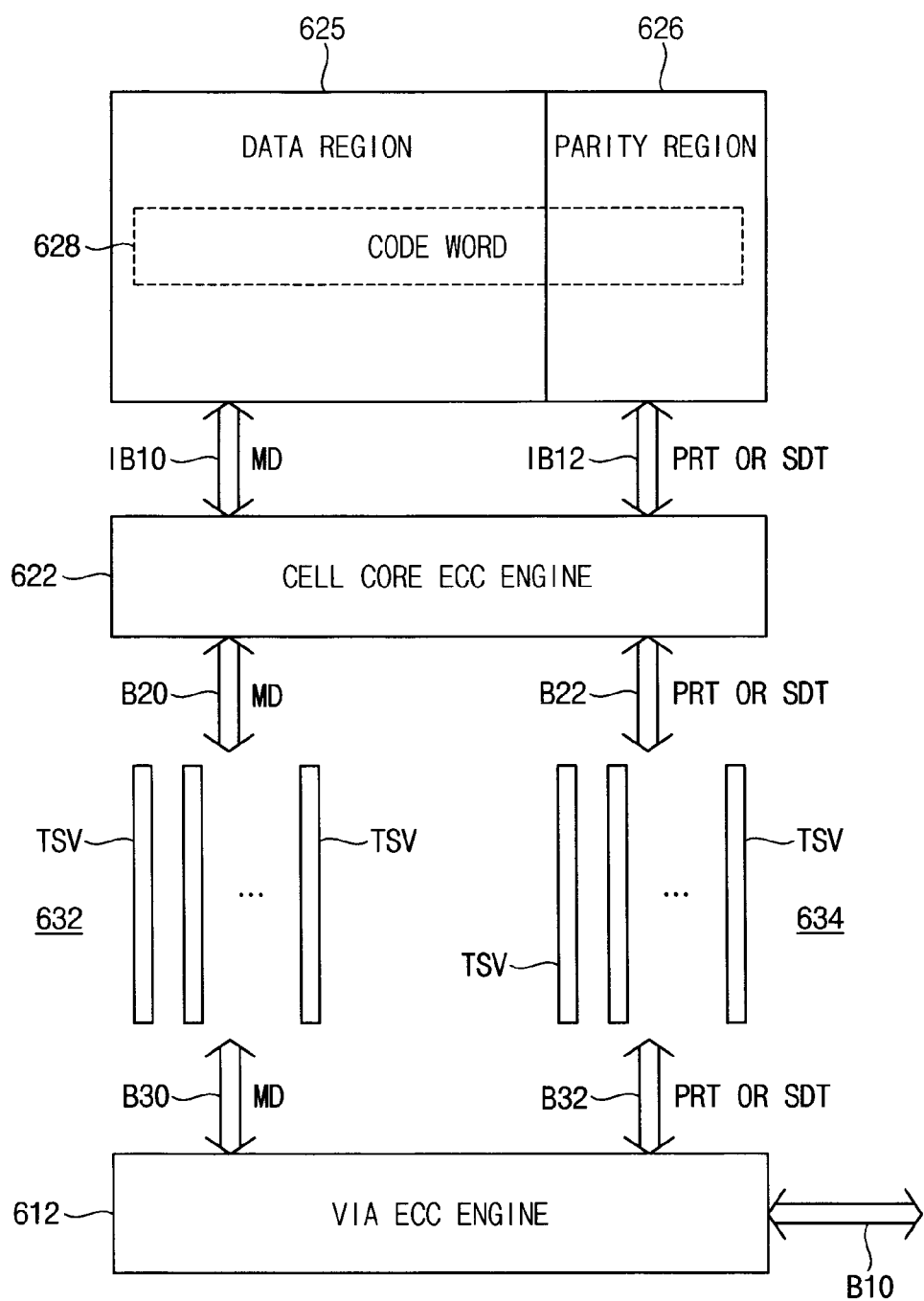
FIG. 20 is a diagram schematically illustrating connections between ECC engines in FIG. 19 according to example embodiments.

FIG. 20 is a diagram schematically illustrating connections between ECC engines in FIG. 19 according to example embodiments.

Referring to FIG. 20, the cell core ECC engine 622 and the via ECC engine 612 may be connected through the data TSV line group 632 and the parity TSV line group 634.

More particularly, one memory die may include a memory cell array, and the memory cell array may include a data region (i.e., a normal cell region) 625 storing the main data MD and a parity region (i.e., a parity cell region) 626 storing the parity data PRT. As mentioned above, the parity region 626 may include a first sub parity region and a second sub parity region. The main data MD is stored in the data region 625 and the parity data PRT or the sub data which the memory controller 100 generates is stored in the parity region 626.

In the case of reading data, a code word 628 may include main data MD from the data region 625 and the parity data PRT from the parity region 626. The cell core ECC engine 622 may receive the main data MD through an internal data bus IB10 and the parity data PRT through an internal parity bus IB12. The cell core ECC engine 622 may check a read error on the main data MD using the parity data PRT and may perform error correction based on the checking result.

The cell core ECC engine 622 may output the error-corrected data (i.e., C_MD) as transmission data through a data bus B20 and may output transmission parity data through the parity bus B22. Here, the transmission parity data may be the same information as the parity data PRT.

The via ECC engine 612 may receive the transmission data through a data bus B30 and the transmission parity data through a parity bus B32. The data bus B20 and the data bus B30 may be implemented with the data TSV line group 632 described with reference to FIG. 19. The parity bus B22 and the parity bus B32 may be implemented with the parity TSV line group 634 described with reference to FIG. 19.

The via ECC engine 612 may perform error checking on the transmission data received through the data TSV line group 632, based on the transmission parity data received through the parity TSV line group 634. When a transmission error is detected through the error checking, the second type ECC engine 612 may correct the transmission error on the transmission data, based on the transmission parity data. For example, in the case where the number of correctable data bits is one, error correction may be impossible when the transmission error which includes two or more error bits occurs. In this case, the second type ECC engine 612 may output information indicating occurrence of a data error to the data bus B10.

Figure 21:
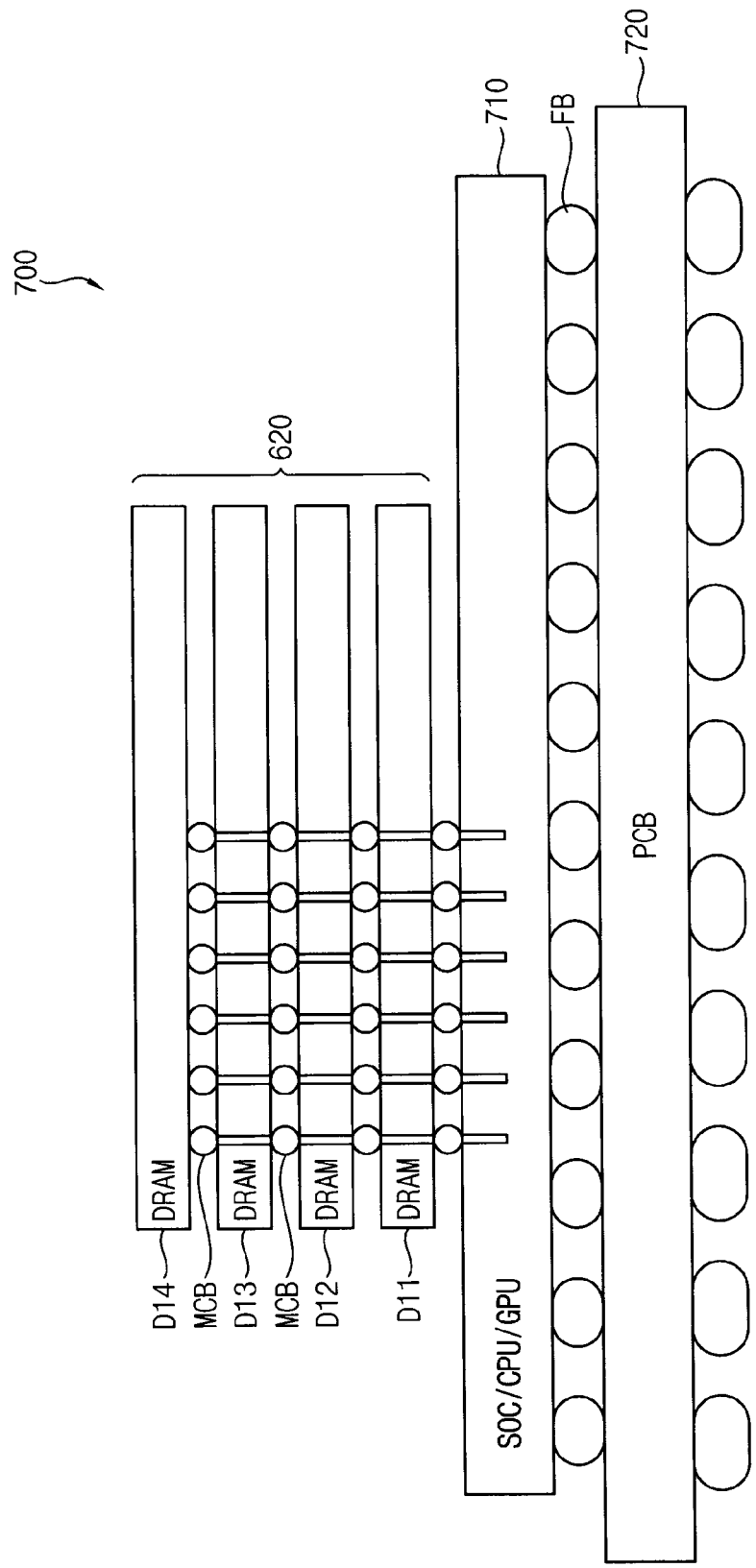
FIG. 21 is a cross-sectional view of a 3D chip structure employing the semiconductor memory device of FIG. 19 according to example embodiments.

FIG. 21 is a cross-sectional view of a 3D chip structure employing the semiconductor memory device of FIG. 19 according to example embodiments.

FIG. 21 shows a 3D chip structure 700 in which a host and a HBM are directly connected without an interposer layer.

Referring to FIG. 21, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure. In FIG. 21, the buffer die 610 or a logic die of FIG. 19 is omitted. However, the buffer die 610 or the logic die may be disposed between the memory die D11 and the host die 710. To implement the HBM structure such as the second group of dies 620 in FIG. 19, TSV lines may be formed at the memory dies D11 to D14. The TSV lines may be electrically connected with micro bumps MCB placed between memory dies.

Figure 22:
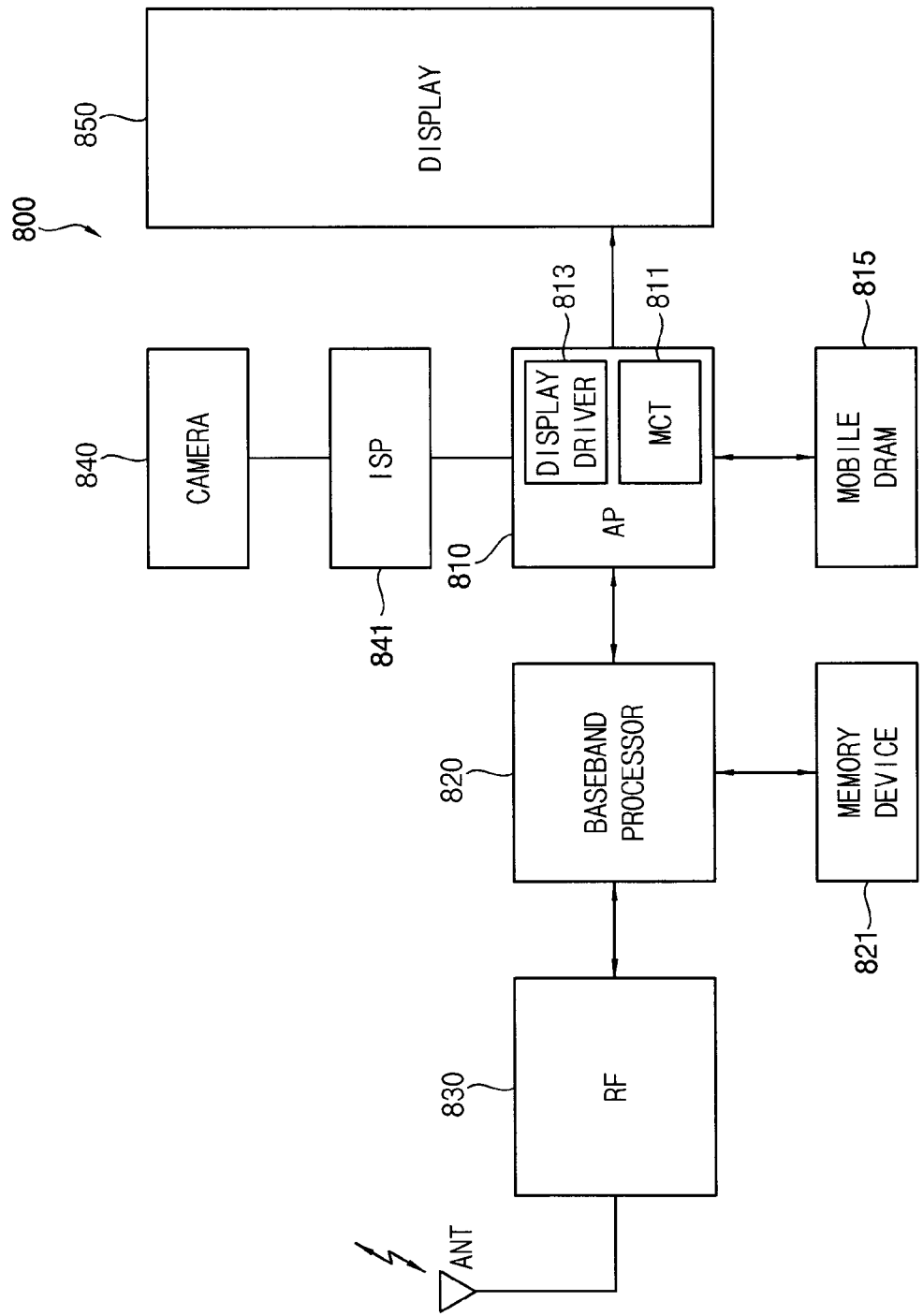
FIG. 22 is a block diagram illustrating a smart phone employing the semiconductor memory device according to example embodiments.

FIG. 22 is a block diagram illustrating a smart phone employing the semiconductor memory device according to example embodiments.

Referring to FIG. 22, a smart phone 800 may be implemented with a mobile computing device. An application processor (AP), for example, a mobile application processor 810 may control components 815, 820, 841, and 850 of the smart phone 800.

The mobile application processor 810 may use a mobile DRAM 815 as a work memory. A memory device 821 may be used as a work and program memory of a baseband processor 820.

In FIG. 22, the mobile DRAM 815 may be implemented with the semiconductor memory device 200 of FIG. 4. A memory controller (MCT) 811 included in the application processor 810 may control an access to the mobile DRAM 815. A display driver 813 included in the application processor 810 may control a display 850.

The baseband processor 820 may allow data to be exchanged between a wireless transceiver 830 and the application processor 810. Data processed by the baseband processor 820 may be sent to the application processor 810 or may be stored at the memory device 821. The memory device 821 may be implemented with a volatile memory or a nonvolatile memory.

Wireless data received through an antenna ANT may be transmitted to the baseband processor 820 by way of the wireless transceiver 830, and data outputted from the baseband processor 820 may be converted into wireless data by the wireless transceiver 830. The converted wireless data may be outputted through the antenna ANT.

The image signal processor 841 may process a signal from a camera (or an image sensor) 840 and may transfer the processed data to the application processor 810.

As mentioned above, the semiconductor memory device may adaptively set ECC levels based on the importance degree of the write data to use the parity cell region as a data storage region to store data which the memory controller generates. Therefore, the semiconductor memory device may increase usability of the parity cell region to reduce the size overhead of the parity cell region.

Aspects of the present inventive concept may be applied to systems using semiconductor memory devices that employ an ECC engine. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A memory system comprising:
a semiconductor memory device including a memory cell array which includes a normal cell region to store a main data and a parity cell region to store parity data; and
a memory controller configured to control the semiconductor memory device, the memory controller including a first error correction code (ECC) engine, the first ECC engine configured to generate a first parity data based on the main data,
wherein the semiconductor memory device comprises:
a second ECC engine configured to generate a second parity data base on the main data; and
a control logic circuit configured to:
in a first error correction mode, disable the second ECC engine and store the main data and the first parity data in the normal cell region and the parity cell region, respectively, and
in a second error correction mode, store the main data in the normal cell region and selectively store either the second parity data or both of the first parity data and the second parity data in the parity cell region.

2. The memory system of claim 1, wherein the parity cell region includes a first sub parity region and a second sub parity region.

3. The memory system of claim 2, wherein the control logic circuit is configured to store the first parity data in the first sub parity region and the second sub parity region in the first error correction mode.

4. The memory system of claim 3, wherein the main data and the first parity data are transmitted to the first ECC engine by bypassing the second ECC engine.

5. The memory system of claim 3, wherein the control logic circuit is configured to disable the second ECC engine in response to a first command designating the first error correction mode being received from the memory controller.

6. The memory system of claim 3, wherein the control logic circuit is configured to enable the second ECC engine in response to a first command designating the second error correction mode being received from the memory controller.

7. The memory system of claim 6, wherein when a second command designating a read operation is received from the memory controller to the semiconductor memory device, the control logic circuit is configured to provide corrected main data generated by the second ECC engine to the memory controller.

8. The memory system of claim 2, wherein the control logic circuit is configured to store the second parity data and the first parity data in the first sub parity region and the second sub parity region, respectively, in the second error correction mode.

9. The memory system of claim 8, wherein the second ECC engine is configured to correct an error bit in the main data based on the second parity data to provide a corrected main data, and
wherein the corrected main data and the first parity data are transmitted to the first ECC engine.

10. The memory system of claim 2, wherein the control logic circuit is configured to store the second parity data in the second sub parity region in the second error correction mode, and the first sub parity region is used for repairing an error in the main data.

11. The memory system of claim 10, wherein the second ECC engine is configured to correct an error bit in the main data based on the second parity data to provide a corrected main data, and
wherein the corrected main data is transmitted to the first ECC engine.

12. The memory system of claim 1, wherein the semiconductor memory device includes:
- a first die group including at least one buffer die; and
- a second die group including a plurality of memory dies stacked on the first die group and conveying data through a plurality of through substrate via (TSV) lines,
- wherein at least one of the plurality of memory dies includes the memory cell array and the second ECC engine configured to generate transmission parity bits using a transmission data to be sent to the at least one buffer die, and
- wherein the at least one buffer die is configured to correct a transmission error using the transmission parity bits when a transmission error is detected from the transmission data received through the plurality of TSV lines.

* * * * *